(12) United States Patent
Lien

(10) Patent No.: US 7,309,918 B2
(45) Date of Patent: Dec. 18, 2007

(54) CHIP PACKAGE STRUCTURE

(75) Inventor: Jeffrey Lien, Taipei (TW)

(73) Assignee: Optimum Care International Tech.Inc., Taipei (TW)

( * ) Notice: Subject to any disclaimer, the term of this patent is extended or adjusted under 35 U.S.C. 154(b) by 413 days.

(21) Appl. No.: 10/974,728

(22) Filed: Oct. 28, 2004

(65) Prior Publication Data

US 2005/0098872 A1    May 12, 2005

(30) Foreign Application Priority Data

Nov. 12, 2003   (TW) .............................. 92131856 A

(51) Int. Cl.
   *H01L 23/34*   (2006.01)
(52) U.S. Cl. .............................. 257/718; 257/E23.083
(58) Field of Classification Search ................. 257/718
   See application file for complete search history.

(56) References Cited

U.S. PATENT DOCUMENTS

| | | | | |
|---|---|---|---|---|
| 3,846,544 | A * | 11/1974 | Schultz ....................... | 424/548 |
| 3,996,447 | A * | 12/1976 | Bouffard et al. ............ | 219/541 |
| 4,415,025 | A * | 11/1983 | Horvath ...................... | 165/185 |
| 4,479,140 | A * | 10/1984 | Horvath ...................... | 257/713 |
| 5,107,330 | A * | 4/1992 | Dahringer ................... | 257/718 |
| 5,287,001 | A * | 2/1994 | Buchmann et al. ......... | 257/719 |
| 5,549,090 | A * | 8/1996 | Blount et al. ............ | 123/406.6 |
| 5,801,330 | A * | 9/1998 | Gademann et al. ......... | 174/559 |
| 5,875,096 | A * | 2/1999 | Gates ......................... | 361/704 |
| 6,297,549 | B1 * | 10/2001 | Hiyoshi ....................... | 257/703 |
| 6,417,563 | B1 * | 7/2002 | Halderman et al. ......... | 257/718 |
| 6,462,952 | B1 * | 10/2002 | Ubukata et al. ............ | 361/719 |
| 6,546,352 | B2 * | 4/2003 | Jahn ............................ | 702/128 |
| 6,967,402 | B2 * | 11/2005 | Hiyoshi ....................... | 257/706 |
| 6,972,485 | B2 * | 12/2005 | Kong et al. ................. | 257/704 |
| 6,977,434 | B2 * | 12/2005 | Martino ....................... | 257/727 |
| 7,012,331 | B2 * | 3/2006 | Brechignac et al. ........ | 257/727 |
| 7,019,976 | B1 * | 3/2006 | Ahmad et al. .............. | 361/704 |
| 2005/0122690 | A1 * | 6/2005 | Hood et al. .................. | 361/709 |
| 2005/0180113 | A1 * | 8/2005 | Shirakami et al. .......... | 361/704 |

* cited by examiner

Primary Examiner—David A. Zarneke

(57) ABSTRACT

This invention relates to a chip package structure comprising of a chip, multiple leads with inner and outer ends, an exposed chip upper surface, an encapsulated body encloses the peripherals of the chip, and multiple conducting wires used to connect electrically the chip and leads, wherein said leads extends internally to the surfaces on the two sides of the chip, in the mean time, pasting method is used to connect the two side surfaces of the chip to the leads in order to carry the chip, therefore, traditional die pad is replaced, furthermore, the outer ends or lower surfaces of the leads are exposed out of encapsulated body, this is to prevent solder overflow and enhance solder aggregation effect, in the mean time, packaging cost can be saved and easier visual positioning and rework can be obtained from this package structure, leads are used as terminals to be electrically connected to the external; therefore, through the internally extended leads structure, die pad is replaced, and the effects of package volume reduction, heat dissipation enhancement, packaging material cost saving and good, stable electrical connection are reached through this package structure.

8 Claims, 3 Drawing Sheets

CHIP PACKAGE STRUCTURE

BACKGROUND OF THE INVENTION

1. Field of the Invention

This invention relates to a chip package structure, it more specifically relates to a structure with inward extended leads to replace die pad such that volume reduction can be achieved, heat dissipation can be enhanced, packaging material cost can be saved, and a good and stable electrical connection can be achieved through this package.

2. Description of the Related Art

Common IC chip suffers from the characteristic of weakness, an appropriate outer package has to be added to it to prevent it from damage or contamination by any external source, furthermore, the chip has to be electrically connected to a circuit board or a carrier board or a leadframe such that the chip can communicate with the external.

In the prior art Taiwan patent no. 515069 titled "leadframe structure", it discloses a carrier structure to hold a chip and to connect the chip electrically to the external, it comprising mainly of: multiple cluster-arranged leads, each lead forms a block shape respectively, the lead further comprising of a top surface and a bottom surface located at the opposite side of the top surface, the top surface is used to accommodate said chip, moreover, at a predetermined position on the bottom surface a dent is formed in a pre-determined depth toward the top surface, the surface of the dent can be electrically connected to the chip, furthermore, the non-dented region is formed naturally at least one connecting part, the connecting part forms a protruding shape relative to the dented part and is used to be electrically connected to the external such that the chip can communicate with the external.

Moreover, another Taiwan patent no. 496578 titled "Semiconductor package structure with a shrunk surface connecting face", comprising of:

A chip, comprising of an upper surface and a lower surface, multiple bonding pads are formed on the upper surface of the chip;

Multiple leads comprising of an upper surface and a lower surface, the leads extending to the lower surface of the chip to carry the chip;

Multiple metallic bonding pads, and the bonding pads of the chip are electrically connected to the upper surface located at the outer end of leads;

An encapsulated body which encloses the chip, metallic bonding wires and the upper surface of the leads, the encapsulated body at least exposes part of the lower surfaces of the multiple leads; and Wherein the exposed lower surface of the leads on the encapsulated body is located at a relative inner end of the leads upper surface, which is used to be electrically connected to the metallic bonding wires.

Although the above-mentioned two prior art structures can correct the drawbacks in conventional chip package, the changes and corrections made are merely on the shape of leadframe leads and the leads lower surface, package volume can still not be lowered and the heat dissipation can not be enhanced or the goals of package material saving can not be reached, moreover, in the prior art packages, good and stable electrical connection of the package is difficult to be reached, therefore, the chips can not be widely used in the printed circuit boards; and the above-mentioned prior art package structures can not fit the demands in practical use.

SUMMARY OF THE INVENTION

Therefore, the main purpose of this invention is to reduce the chip package volume, to enhance the heat dissipation, to save packaging material cost, and to possess good and stable electrical connection effects.

To achieve the above-mentioned goal, this invention provides a brand new chip package structure, the structure further comprising of a chip, multiple leads connected electrically to the chip, and multiple conducting wires which electrically connect the two side surface of chip and the leads, furthermore, the chip, leads and conducting wires are enclosed inside an encapsulated body, the leads outer end or lower surface are exposed out of encapsulated body, this is to prevent solder overflow and enhance solder aggregation effect, in the mean time, packaging cost can be saved and easier visual positioning and rework can be obtained, furthermore, chip is electrically connected to the printed circuit board through the package structure, and the effects of package volume reduction, heat dissipation enhancement and packaging material cost saving and good, stable electrical connection are reached through this package structure.

DETAILED DESCRIPTION OF THE INVENTION

Figure 1:
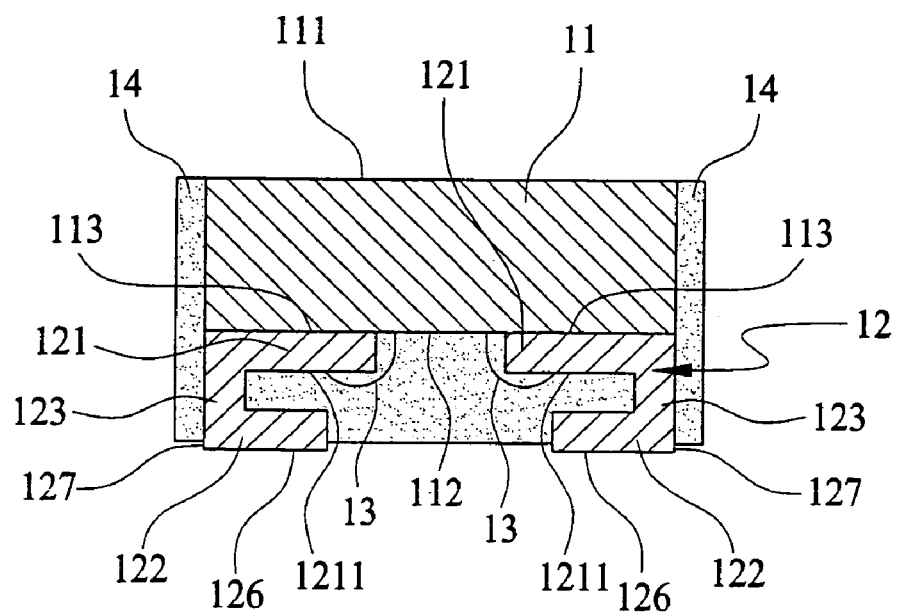
FIG. 1 is the package structure cross sectional view for the current invention.
Figure 1:
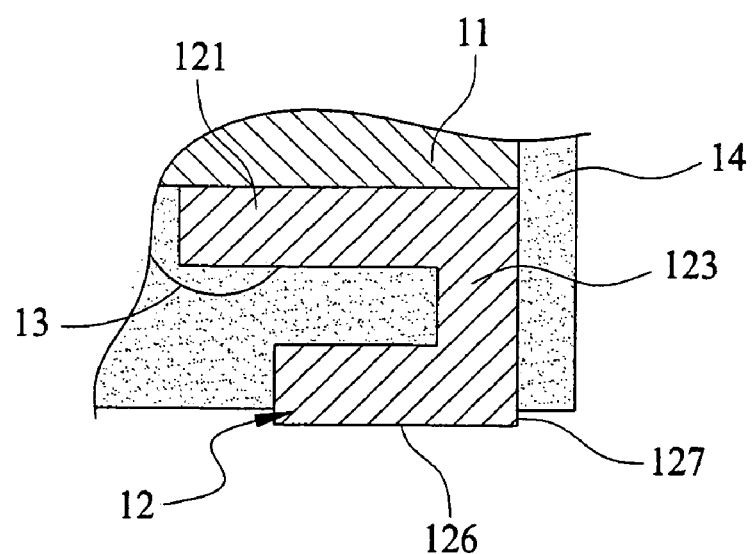
Figure 2:
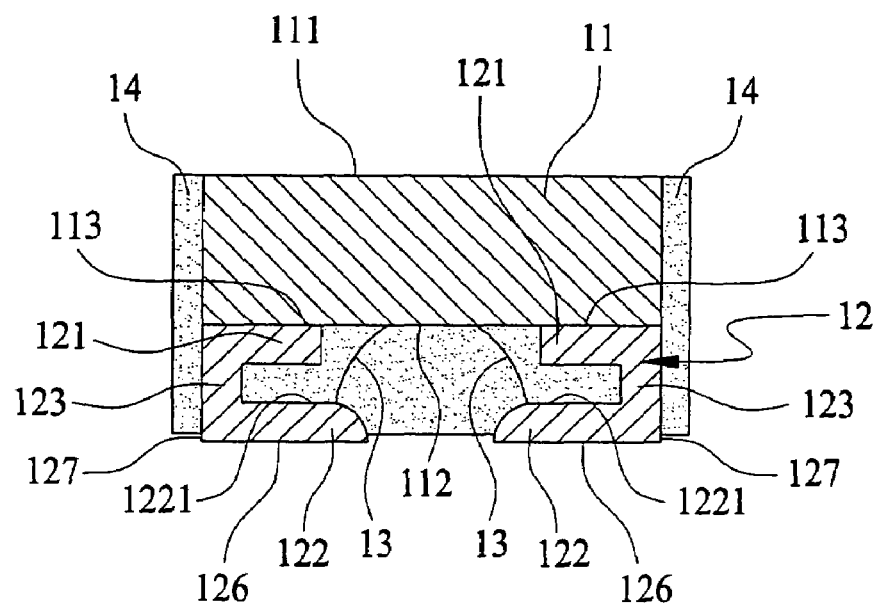
FIG. 2 is the cross sectional view of the package structure embodiment for the current invention.

Please refer to FIGS. 1 and 2, they are cross sectional views of an embodiment for this invention. As shown in the figure: This invention discloses a chip package structure, it has the effects of shrinking the packaged volume and enhancing the package heat dissipation, it also saves packaging materials and possesses good and stable electrical connection.

The above mentioned package structure comprising of a chip 11, multiple leads 12 with very good electrical conducting property, multiple conducting wires 13 connecting electrically chip 11 and leads 12, and an encapsulated body 14 which encloses the chip 11; wherein the chip 11 could be memory chip, CPU, logic chip or RF radio frequency chip, it could be composed of material such as silicon, GaAs, or other semiconductor materials, the chip 11 comprising of an upper surface 111 and surface 112, the upper surface 111 of chip 11 exposes out of encapsulated body 14 such that heat dissipation can be enhanced and packaging material cost can be saved.

The multiple leads 12 are arranged in specific order, leads 12 extends from two sides of chip 11 inward into the two side surfaces of chip 11, leads 12 and the two side surfaces of chip 11 are connected by adhesive material 113, that is, chip 11 is carried through a pasting method to replace die pad, furthermore, the outer ends 127 of leads 12 or the lower surface 126 are exposed out of encapsulated body 14, this is to prevent solder overflow and enhance solder aggregation effect, in the mean time, packaging cost can be saved and easier visual positioning and rework can be obtained, furthermore, leads 12 can thus be used as terminals for external electrical connection.

Please refer to FIGS. 1 and 2 for the first embodiment of the current invention, the leads 12 are formed by semi etching or pressing method, two parallel sections 121, 122 and one vertical section 123 which connect them, one of the parallel section 121 has area larger than that of parallel section 122 such that one larger section and one smaller section are formed, the two parallel sections 121 and 122 are actual horizontal surfaces, the lower surface 112 of chip 11 is connected to the lower surface 1211 (as shown in FIG. 1) of one of the parallel section 121 through conducting wires 13, furthermore, the lower surface 112 of chip 11 can be connected to the upper surface 1221 of another parallel section 122 through conducting wires 13 according to actual need, moreover, the upper surface 1221 forms an curved shape (as shown in FIG. 2), chip 11 is electrically connected to the printed circuit board through conducting wires 13 and leads 12, in the current embodiment, leads 12 have shorter surface adhesion width in order to reduce surface adhesion area, and encapsulated body 14 is used to protect chip 11 from the attack of moisture and dust, it is basically an epoxy compound, an adhesive material and a silicon-oxy thermosetting insulating encapsulated material, it encloses chip 11, leads 12 and conducting wires 13, only outer ends 127 of leads 12 and surface 126 of leads 12 are exposed out of encapsulated body 14 to be used as terminals to be connected electrical to the external; therefore, a brand new chip package structure is formed.

Figure 3:
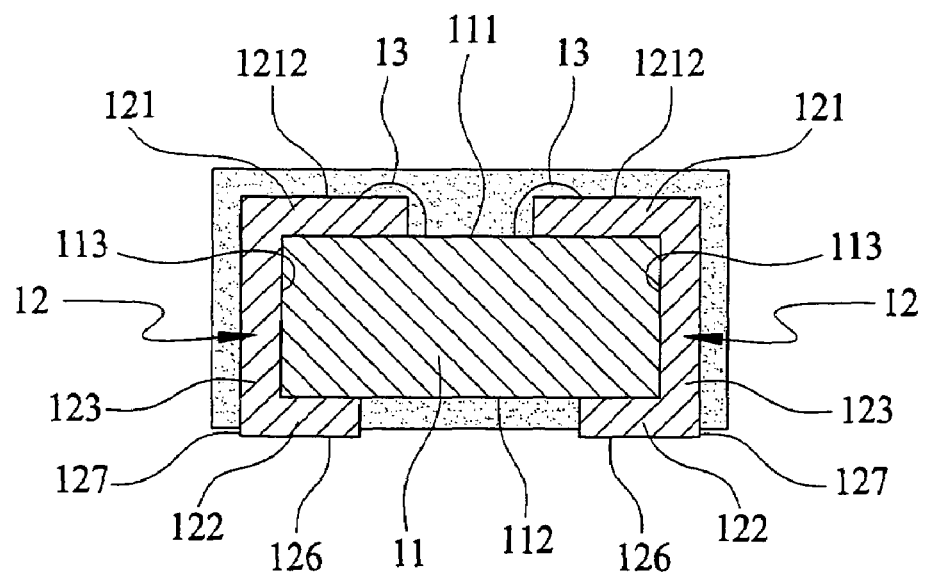
FIG. 3 is the cross sectional view of the package structure of another embodiment for the current invention.

Please refer to FIG. 3, it is another embodiment for the current invention. As shown in the figure: leads 12 can be installed across the two sides of chip 11, the inner upper surfaces of parallel sections 121, 122 of leads 12 are pasted to chip 11 through adhesive material 113, therefore, a pasting method is used to carry chip 11 instead of using die pad, and surface 111 of chip 11 is electrically connected to leads 12 through conducting wires 13.

Figure 4:
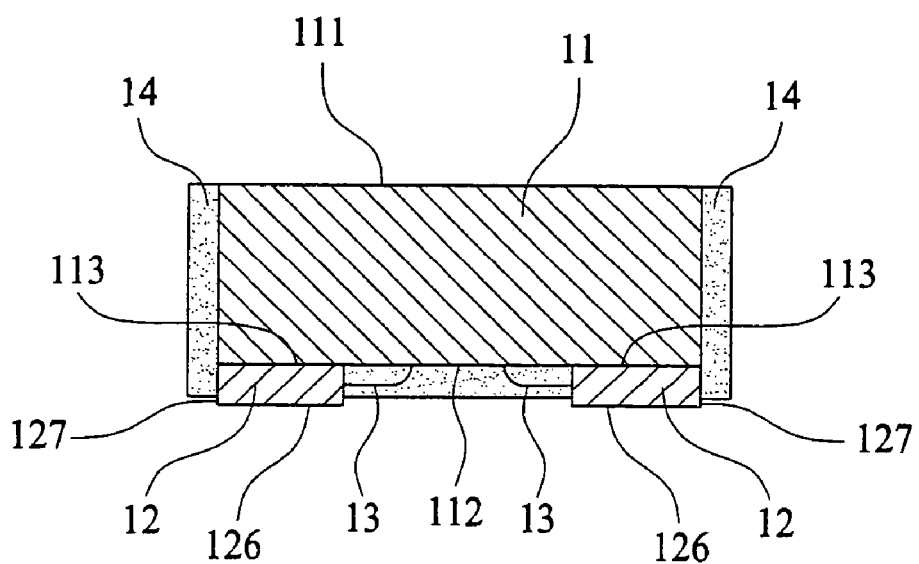
FIG. 4 is the cross sectional view of the package structure of yet another embodiment for the current invention.
Figure 5:
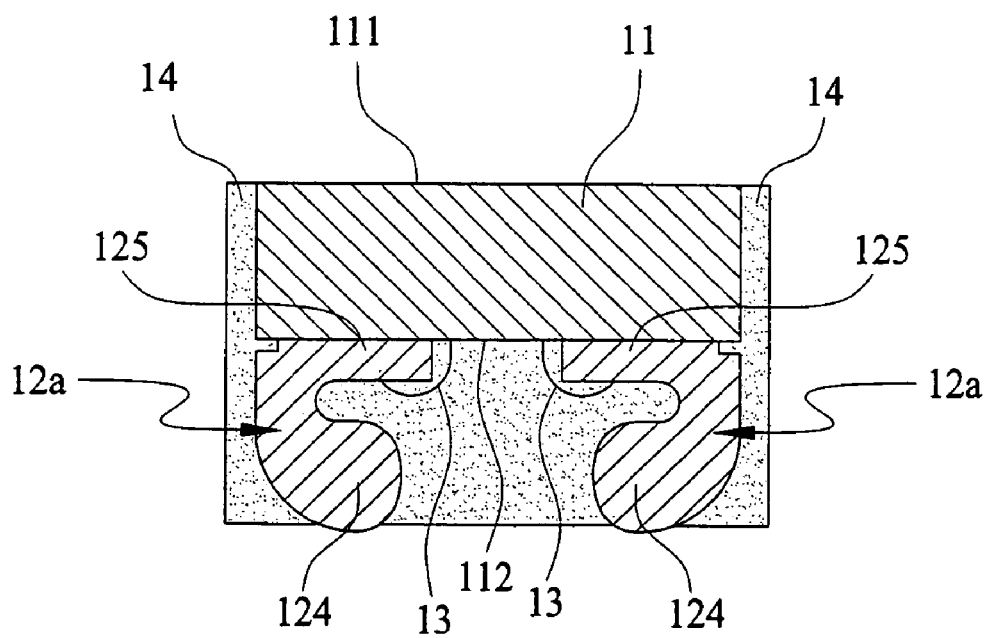
FIG. 5 is the cross sectional view of the package structure of further another embodiment for the current invention.

Please refer to FIG. 4, it is the cross sectional view of yet another embodiment of the current invention. As shown in the figure: Leads 12 are installed and arranged in certain order, leads 12 extend internally from the two sides of chip 11 to the two side surfaces of chip 11, the contact part between leads 12 and two side surfaces of chip 11 is pasted by adhesive material 113, therefore, pasting method is used to carry chip 11 to replace conventional die pad, the outer ends 127 or lower surfaces 126 of leads 12 are exposed out of encapsulated body 14 to be used as terminals to be connected electrically to the external, the lower surface 112 of chip 11 is connected to one side edge of leads 12 through conducting wires 13.

Please refer to FIG. 4; it is the cross sectional view of further another embodiment of the current invention. As shown in the figure: leads 12a comprising of a curved arc part 124 and a planar part 125, in the mean time, one surface of the planar part 125 of leads 12a is pasted to the lower surface 112 of chip 11 by adhesive material 113, and the lower surface 112 of chip 11 is electrically connected to another surface of planar part 125 of leads 12a through conducting wires 13.

From the above descriptions, we can clearly see that the leads in this embodiment not only is simple in its structure and shape, but also is easy to be manufactured and is of low cost in production, furthermore, the external electrical connection is a terminal of very thin thickness, therefore the packaged volume can be greatly reduced and heat dissipation property can be greatly enhanced and material cost greatly reduced; moreover, since the volume and length of the leads is reduced, the distance between the contact point of the chip and the contact point of the printed circuit board is then greatly reduced, and the transmission speed of the chip can then be enhanced, this meets the market trend and demand.

All those embodiments mentioned are only better embodiments of the current invention, they are not meant to be used to limit the scope of the current invention: for those skilled in the arts can still make simple and equivalent change and modification without deviating from the claims and descriptions in this specification, they shall fall in the scope of this invention.

What the invention claimed is:

1. A chip package structure comprising of a chip, multiple leads with excellent electrical conductivity, multiple conducting wires electrically connecting the chip to the leads, and an encapsulated body; its main features are: multiple leads are arranged and installed in certain order, those leads extend internally from two sides of the chip to the two side surfaces of the chip, the contact part between those leads and the two side surfaces is adhesive material, therefore, pasting method is used to carry the chip to replace conventional way of die pad, and the outer ends of leads or the lower surfaces of leads are exposed out of encapsulated body and used as terminals foe external electrical connection.

2. The chip package structure of claim 1 wherein the encapsulated body encloses the chip and exposes the upper surface of the chip.

3. The chip package structure of claim 1 wherein the leads of the chip comprising of two parallel sections and a vertical section connecting the two parallel sections, and conducting wires are connected to one surface of one of the parallel sections.

4. The chip package structure of claim 3 wherein one of the two parallel sections is greater than the other parallel section, therefore a status of one big and one small parallel section is formed.

5. The chip package structure of claim 1 wherein the leads are able to be connected to the lower surface of the chip, and the lower surface of the chip is electrically to the leads through conducting wires.

6. The chip package structure of claim 1 wherein the leads are able to be installed across the two sides of the chip, and the surface of the chip is electrically connected to the leads through conducting wires.

7. The chip package structure of claim 1 wherein the conducting wires are able to be electrically connected to the one side edge of the leads.

8. The chip package structure of claim 5 wherein the leads are of rectangular block shapes.

\* \* \* \* \*